United States Patent
Xiao et al.

(10) Patent No.: US 11,309,327 B2
(45) Date of Patent: Apr. 19, 2022

(54) METHOD FOR FORMING CHANNEL HOLE PLUG OF THREE-DIMENSIONAL MEMORY DEVICE

(71) Applicant: Yangtze Memory Technologies Co., Ltd., Hubei (CN)

(72) Inventors: Li Hong Xiao, Hubei (CN); Zhenyu Lu, Hubei (CN); Qian Tao, Hubei (CN); Yushi Hu, Hubei (CN); Jun Chen, Hubei (CN); LongDong Liu, Hubei (CN); Meng Wang, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

(21) Appl. No.: 16/046,634

(22) Filed: Jul. 26, 2018

(65) Prior Publication Data
US 2019/0326314 A1    Oct. 24, 2019

Related U.S. Application Data

(63) Continuation of application No. PCT/CN2018/083536, filed on Apr. 18, 2018.

(51) Int. Cl.
*H01L 27/1157* (2017.01)
*H01L 27/11524* (2017.01)
(Continued)

(52) U.S. Cl.
CPC .... *H01L 27/11582* (2013.01); *H01L 27/1157* (2013.01); *H01L 27/11524* (2013.01);
(Continued)

(58) Field of Classification Search
CPC ............ H01L 27/1052; H01L 27/1085; H01L 27/10855; H01L 27/11507; H01L 27/1157;
(Continued)

(56) References Cited

U.S. PATENT DOCUMENTS

| 8,362,482 B2 | 1/2013 | Or-Bach et al. |
| 8,378,409 B2 | 2/2013 | Park |

(Continued)

FOREIGN PATENT DOCUMENTS

| CN | 102034829 A | 4/2011 |
| CN | 102280412 A | 12/2011 |

(Continued)

OTHER PUBLICATIONS

International Search Report and Written Opinion of the International Searching Authority directed to related International Patent Application No. PCT/CN2018/083536, dated Jan. 29, 2019; 9 pages.

*Primary Examiner* — Natalia A Gondarenko
(74) *Attorney, Agent, or Firm* — Sterne, Kessler, Goldstein & Fox P.L.L.C.

(57) ABSTRACT

Embodiments of a channel hole plug structure of 3D memory devices and fabricating methods thereof are disclosed. The memory device includes an alternating layer stack disposed on a substrate, an insulating layer disposed on the alternating dielectric stack, a channel hole extending vertically through the alternating dielectric stack and the insulating layer, a channel structure including a channel layer in the channel hole, and a channel hole plug in the insulating layer and above the channel structure. The channel hole plug is electrically connected with the channel layer. A projection of the channel hole plug in a lateral plane covers a projection of the channel hole in the lateral plane.

9 Claims, 16 Drawing Sheets

(51) Int. Cl.
*H01L 27/11556* (2017.01)
*H01L 27/11582* (2017.01)
*H01L 21/28* (2006.01)

(52) U.S. Cl.
CPC .. *H01L 27/11556* (2013.01); *H01L 29/40114* (2019.08); *H01L 29/40117* (2019.08)

(58) Field of Classification Search
CPC ............. H01L 27/1159; H01L 27/1524; H01L 27/11521; H01L 27/11529; H01L 27/11524; H01L 27/11556; H01L 27/11582; H01L 21/28; H01L 21/469; H01L 21/47; H01L 21/475; H01L 21/3212; H01L 21/31116; H01L 21/76877; H01L 21/7687–76883; H01L 21/76802; H01L 21/76805; H01L 21/7681; H01L 21/76811; H01L 21/76813; H01L 21/76814; H01L 21/8239; H01L 23/481; H01L 23/485; H01L 23/4855; H01L 23/522–53295; H01L 23/5384; H01L 29/40117; H01L 29/40114; H01L 29/66833; H01L 27/1128; H01L 27/11578; H01L 229/7889; H01L 29/7926; H01L 27/11551; H01L 27/11563
USPC ........................... 257/314, 324; 438/268, 700
See application file for complete search history.

(56) References Cited

U.S. PATENT DOCUMENTS

| | | | |
|---|---|---|---|
| 8,569,827 B2 * | 10/2013 | Lee | H01L 27/11582 257/324 |
| 8,817,514 B2 | 8/2014 | Samachisa et al. | |
| 9,305,849 B1 | 4/2016 | Tsutsumi et al. | |
| 9,406,690 B2 * | 8/2016 | Pang | H01L 27/11556 |
| 9,449,982 B2 * | 9/2016 | Lu | H01L 21/0337 |
| 9,520,408 B2 * | 12/2016 | Kim | H01L 23/528 |
| 9,559,117 B2 * | 1/2017 | Pachamuthu | H01L 23/528 |
| 9,666,434 B2 | 5/2017 | Kim et al. | |
| 10,115,799 B2 | 10/2018 | Park et al. | |
| 10,181,475 B2 | 1/2019 | Jhang et al. | |
| 2010/0109065 A1 | 5/2010 | Oh et al. | |
| 2011/0073866 A1 | 3/2011 | Kim et al. | |
| 2011/0291172 A1 | 12/2011 | Hwang et al. | |
| 2011/0306195 A1 | 12/2011 | Kim et al. | |
| 2013/0028027 A1 | 1/2013 | Kim et al. | |
| 2013/0229846 A1 | 9/2013 | Chien et al. | |
| 2014/0103414 A1 | 4/2014 | Koldiaev et al. | |
| 2014/0273373 A1 | 9/2014 | Makala et al. | |
| 2015/0069494 A1 | 3/2015 | Makala et al. | |
| 2015/0076586 A1 * | 3/2015 | Rabkin | G11C 16/0483 257/324 |
| 2015/0115350 A1 | 4/2015 | Maejima | |
| 2015/0294978 A1 | 10/2015 | Lu et al. | |
| 2015/0340370 A1 * | 11/2015 | Kim | H01L 21/76897 365/185.18 |
| 2016/0148835 A1 * | 5/2016 | Shimabukuro | H01L 27/11556 257/314 |
| 2016/0225621 A1 | 8/2016 | Seo et al. | |
| 2017/0077108 A1 * | 3/2017 | Kawaguchi | H01L 27/11582 |
| 2017/0213843 A1 | 7/2017 | Choi | |
| 2017/0256558 A1 | 9/2017 | Zhang et al. | |

FOREIGN PATENT DOCUMENTS

| | | |
|---|---|---|
| CN | 102800676 A | 11/2012 |
| CN | 104637883 A | 5/2015 |
| CN | 105261629 A | 1/2016 |
| CN | 106653684 A | 5/2017 |
| CN | 106920772 A | 7/2017 |
| CN | 107564915 A | 1/2018 |
| CN | 107611129 A | 1/2018 |
| CN | 107658222 A | 2/2018 |
| KR | 20150070746 A | 6/2015 |
| WO | WO-2018/055692 A1 | 3/2018 |
| WO | WO 2019/041892 A1 | 3/2019 |

* cited by examiner

METHOD FOR FORMING CHANNEL HOLE PLUG OF THREE-DIMENSIONAL MEMORY DEVICE

CROSS-REFERENCE TO RELATED APPLICATIONS

This application claims priority to PCT/CN2018/083536 filed on Apr. 18, 2018, the entire contents of which are incorporated herein by reference.

TECHNICAL FIELD

The present disclosure generally relates to the field of semiconductor technology, and more particularly, to a channel hole plug structure of three-dimensional (3D) memory devices and a method for forming the same.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As such, memory density for planar memory cells approaches an upper limit. A three-dimensional (3D) memory architecture can address the density limitation in planar memory cells.

As semiconductor technology advances, 3D memory devices, such as 3D NAND memory devices, keep scaling more oxide/nitride (ON) layers. As a result, etching processes of channel holes become more and more challenging. Further, aligning a metal via to electrically connect with a channel hole is also a challenging topic in the art.

BRIEF SUMMARY

Embodiments of channel hole plugs of 3D memory devices and fabrication methods thereof are disclosed herein.

Disclosed is a method for forming a channel hole plug structure in a three-dimensional (3D) memory device. The method can comprise: forming an alternating dielectric stack disposed on a substrate; forming an insulating layer and a hard mask layer on the alternating dielectric stack; forming a channel structure penetrating the insulating layer, the hard mask layer, and the alternating dielectric stack; forming a photoresist patterning on the hard mask layer; using the photoresist patterning as a mask to remove a top portion of the channel structure to form a recess; and forming a channel hole plug in the recess. A projection of the channel hole plug in a lateral plane covers a projection of the channel hole in the lateral plane.

In some embodiments, forming the alternating dielectric stack comprises forming at least 32 dielectric layer pairs stacked in a vertical direction, each dielectric layer pair includes a first dielectric layer and a second dielectric layer that is different from the first dielectric layer. In some embodiments, forming the alternating dielectric stack comprises forming at least 32 dielectric layer pairs stacked in a vertical direction, each dielectric layer pair includes a silicon oxide layer and a silicon nitride layer.

In some embodiments, forming the insulating layer and the hard mask layer comprises: forming an oxide layer on the alternating dielectric stack as the insulating layer; and forming a nitride layer on the oxide layer as the hard mask layer.

In some embodiments, forming the channel structure comprises: forming a channel hole extending vertically through the alternating dielectric stack, the insulating layer and the hard mask layer; forming a functional layer on a sidewall of the channel hole; forming a channel layer covering a sidewall of the functional layer; and forming a filling structure to cover a sidewall of the channel layer and filling the channel hole.

In some embodiments, forming the functional layer comprises: forming a barrier layer on the sidewall of the channel hole for blocking an outflow of the electronic charge; forming a storage layer on the surface of the barrier layer for storing electronic charges during operation of the 3D memory device; and forming a tunneling layer on the surface of the storage layer for tunneling electronic charges.

In some embodiments, forming the photoresist patterning comprises: forming a photoresist layer on the hard mask layer and the channel structure; forming an opening in the photoresist layer to expose the top surface of the channel structure, wherein a diameter of the opening is equal to or larger than a diameter of the top surface of the channel structure; and removing the photoresist layer.

In some embodiments, forming the channel hole plug in the recess comprises: forming a semiconductor channel layer on the hard mask layer and in the recess to electrically connect with the channel layer in the channel structure; and removing a portion of the semiconductor channel layer that is outside of the recess, and to planarize a top surface of the channel hole plug.

In some embodiments, the method further comprises forming a metal via to electrically connect with the channel hole plug.

In some embodiments, the method further comprises: forming a second alternating dielectric stack on the channel hole plug; forming a second channel structure penetrating the second alternating dielectric stack. A second channel layer in the second channel structure is electrically connected with the channel hole plug.

In some embodiments, the method further comprises replacing first dielectric layers with conductor layers. Another aspect of the present disclosure provides a method for forming a channel hole plug structure in a three-dimensional (3D) memory device. The method comprises: forming an alternating dielectric stack disposed on a substrate; forming a first insulating layer on the alternating dielectric stack; forming a channel structure penetrating the first insulating layer and the alternating dielectric stack; forming a second insulating layer, a hard mask layer, and a photoresist patterning on the first insulating layer; forming an opening in the hard mask layer and the photoresist layer to expose the second insulating layer, wherein a projection of the opening in a lateral plane covers a top surface of the channel structure; removing a portion of the second insulating layer above the channel structure to form a recess using the hard mask layer or the photoresist layer as a mask; and forming a channel hole plug in the recess. A projection of the channel hole plug in a lateral plane covers a projection of the channel hole in the lateral plane.

In some embodiments, forming the second insulating layer, the hard mask layer and the photoresist patterning comprises: forming an oxide layer on the first insulating layer and the channel structure as the second insulating layer; forming a nitride layer on the oxide layer as the hard mask layer; and forming a photoresist layer on the nitride layer.

In some embodiments, forming the channel hole plug in the recess comprises: forming a semiconductor channel layer on the hard mask layer and in the recess to electrically connect with the channel layer in the channel structure; and removing a portion of the semiconductor channel layer that is outside of the recess, and to planarize a top surface of the channel hole plug Another aspect of the present disclosure provides a three-dimensional (3D) memory device, comprising: an alternating layer stack disposed on a substrate; an insulating layer disposed on the alternating dielectric stack; a channel hole extending vertically through the alternating dielectric stack and the insulating layer; a channel structure including a channel layer in the channel hole; and a channel hole plug in the insulating layer and above the channel structure. The channel hole plug is electrically connected with the channel layer. A projection of the channel hole plug in a lateral plane covers a projection of the channel hole in the lateral plane.

In some embodiments, the alternating layer stack comprises at least 32 dielectric layer pairs stacked in a vertical direction, each dielectric layer pair includes a first dielectric layer and a second dielectric layer that is different from the first dielectric layer. In some embodiments, the alternating layer stack comprises at least 32 dielectric layer pairs stacked in a vertical direction, each dielectric layer pair includes a silicon oxide layer and a silicon nitride layer.

In some embodiments, the alternating dielectric layer comprises at least 32 dielectric/conductor layer pairs stacked in a vertical direction, each dielectric layer pair includes a dielectric layer and a metal layer. In some embodiments, the alternating dielectric layer comprises at least 32 dielectric/conductor layer pairs stacked in a vertical direction, each dielectric layer pair includes a silicon oxide layer and a tungsten layer.

In some embodiments, the insulating layer is an oxide layer, and the channel hole plug is a polysilicon layer.

In some embodiments, the channel structure comprises a functional layer and a filling structure that sandwich the channel layer.

In some embodiments, the functional layer comprises: a barrier layer on the sidewall of the channel hole configured to block an electric outflow tunnel electronic charges; a storage layer on the surface of the barrier layer configured to store electronic charges; and a tunneling layer between the storage layer and the channel layer configured to tunnel electronic charges.

In some embodiments, a thickness of the channel hole plug is in a range from 100 nm to 1000 nm, and a minimum diameter of the channel hole plug is 100 nm.

In some embodiments, the device further comprises: a second alternating layer stack on the channel hole plug; and a second channel structure penetrating the second alternating layer stack. A second channel layer in the second channel structure is electrically connected with the channel hole plug. In some embodiments, the device further comprises a metal via electrically connected with the channel hole plug.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

DETAILED DESCRIPTION

Figure 1:
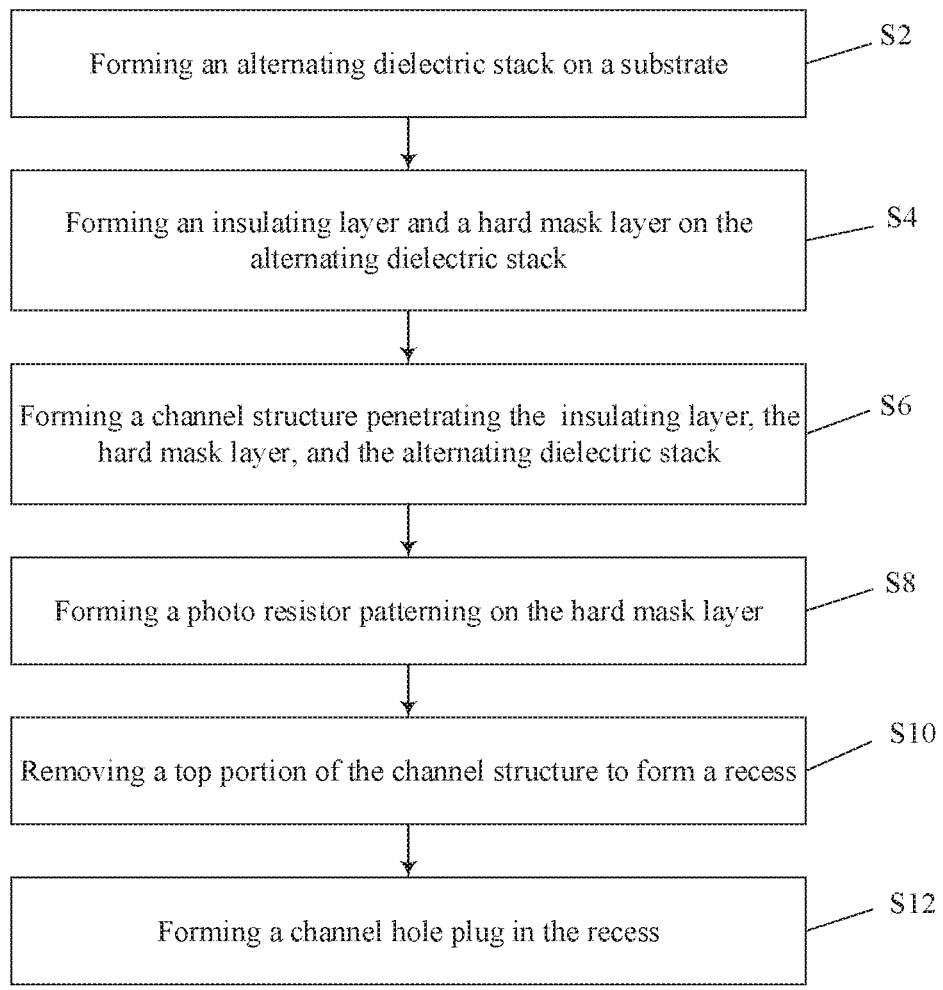
FIG. 1 illustrates a flow diagram of an exemplary method for forming a channel hole plug of a 3D memory device in accordance with some embodiments of the present disclosure.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

Various embodiments in accordance with the present disclosure provide a 3D memory device with channel hole plug structures for a memory array (also referred to herein as an "array device") and fabricating methods for forming the channel hole plug structures. In some embodiments, a channel hole can be formed to penetrate an alternating stack including a plurality of conductive/dielectric pairs or a plurality of oxide/nitride pairs. The number of the conductive/dielectric pairs or oxide/nitride pairs can be larger than or equal to 32. A polycrystalline silicon (polysilicon) plug can be formed above the channel hole to electrically connect with a channel structure in the channel hole and to cover the channel hole. That is, a projection of the polysilicon plug can in a lateral plane can fully cover the projection of the channel hole in the lateral plane. As such, the polysilicon plug can provide a reliable electrical connection to the channel structure in the channel hole and an increased area for contact alignment in the subsequent processes.

Referring to FIG. 1, a flow diagram of an exemplary method for forming a channel hole plug of a 3D memory device is shown in accordance with some embodiments of the present disclosure. FIGS. 2A-2H illustrate cross-sectional views of a region of an exemplary 3D memory device at certain fabricating stages of the method shown in FIG. 1.

As shown in FIG. 1, the method starts at operation S2, in which an alternating dielectric stack is formed on a substrate. In some embodiments, the substrate can be any suitable semiconductor substrate having any suitable structure, such as a monocrystalline single-layer substrate, a polycrystalline silicon (polysilicon) single-layer substrate, a polysilicon and metal multi-layer substrate, etc.

Figure 2A:
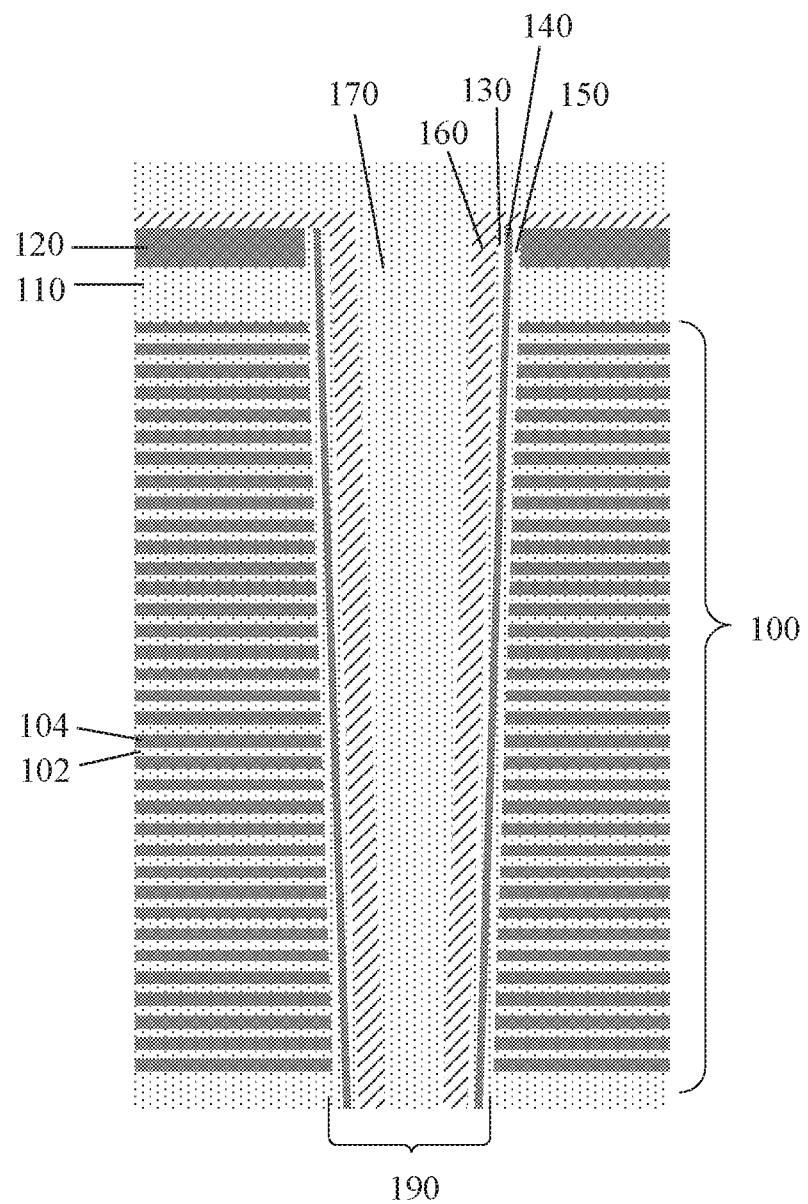
FIGS. 2A-2H illustrate cross-sectional views of a region of an exemplary 3D memory device at certain fabricating stages of the method shown in FIG. 1.

As shown in FIG. 2A, an alternating dielectric stack 100 including a plurality of dielectric layer pairs can be formed on the substrate (not shown in FIG. 2A). The alternating dielectric stack 100 can include an alternating stack of a first dielectric layer 102 and a second dielectric layer 104 that is different from first dielectric layer. The plurality of first dielectric layers 102 and second dielectric layers 104 are extended in a lateral direction that is parallel to a surface of the substrate. In some embodiments, there are more layers than the dielectric layer pairs made of different materials and with different thicknesses in the alternating dielectric stack 100. The alternating dielectric stack 100 can be formed by one or more thin film deposition processes including, but not limited to, Chemical Vapor Deposition (CVD), Physical Vapor Deposition (PVD), Atomic Layer Deposition (ALD), or any combination thereof.

In some embodiments, the alternating dielectric stack 100 can include a plurality of oxide/nitride layer pairs. Each dielectric layer pair includes a layer of silicon oxide 102 and a layer of silicon nitride 104. The plurality of oxide/nitride layer pairs are also referred to herein as an "alternating oxide/nitride stack." That is, in the alternating dielectric stack 100, multiple oxide layers 102 (shown in the areas with dotes) and multiple nitride layers 104 (shown in the areas with meshes) alternate in a vertical direction. In other words, except a top and a bottom layer of a given alternating oxide/nitride stack, each of the other oxide layers 102 can be sandwiched by two adjacent nitride layers 104, and each of the nitride layers 104 can be sandwiched by two adjacent oxide layers 102.

Oxide layers 102 can each have the same thickness or have different thicknesses. For example, a thickness of each oxide layer can be in a range from 90 nm to 160 nm, preferably about 150 nm. Similarly, nitride layers 104 can each have the same thickness or have different thicknesses. For example, a thickness of each nitride layer can be in a range from 80 nm to 110 nm, preferably about 100 nm.

It is noted that, in the present disclosure, the oxide layers 102 and/or nitride layers 104 can include any suitable oxide materials and/or nitride materials. For example, the element of the oxide materials and/or nitride materials can include, but not limited to, tungsten (W), cobalt (Co), copper (Cu), aluminum (Al), doped silicon, silicides, or any combination thereof. In some embodiments, the oxide layers can be silicon oxide layers, and the nitride layers can be silicon nitride layer.

The alternating dielectric stack 100 can include any suitable number of layers of the oxide layers 102 and the nitride layers 104. In some embodiments, a total number of layers of the oxide layers 102 and the nitride layers 104 in the alternating dielectric stack 100 is equal to or larger than 64. That is, a number of oxide/nitride layer pairs can be equal to or larger than 32. In some embodiments, alternating oxide/nitride stack includes more oxide layers or more nitride layers with different materials and/or thicknesses than the oxide/nitride layer pair.

As shown in FIGS. 1 and 2A, the method proceeds to operation S4, in which an insulating layer 110 and a hard mask layer 120 can be formed on the alternating dielectric stack 100. In some embodiments, the insulating layer 110 can be the insulating layer 110 can be made by any suitable insulating material and/or dielectric material, such as silicon oxide. It is noted that, the material of the insulating layer 110 is different from the material of the nitride layer 104 in the alternating dielectric stack 100. The insulating layer 110 can be formed on the top surface of the alternating dielectric stack 100. The hard mask layer 120 can be formed on the top surface of the insulating layer 110. In some embodiments, the hard mask layer 120 can include a nitride layer, such as a silicon nitride layer. The insulating layer 110 and the hard mask layer 120 can be formed by using any suitable deposition process including, but not limited to, CVD, PVD, ALD, and/or any suitable combination thereof.

Figure 2B:
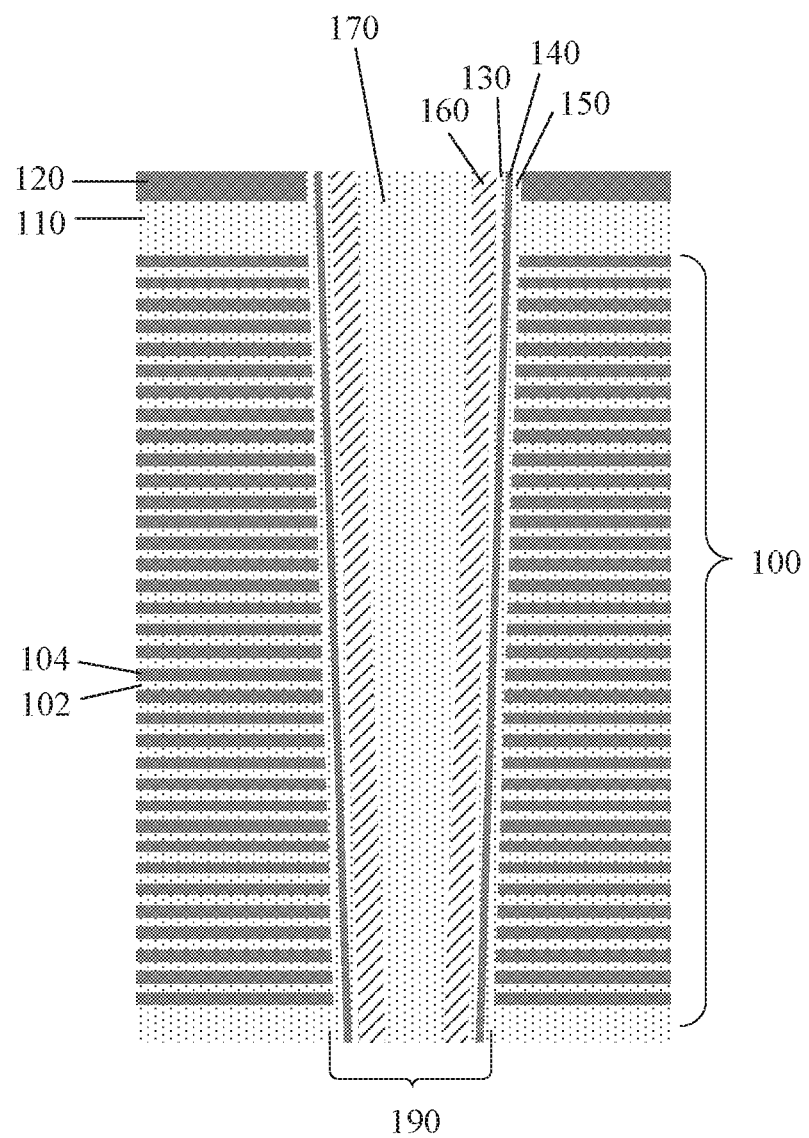

Referring to FIGS. 1 and 2A-2B, the method proceeds to operation S6, in which a channel structure can be formed. The channel structure can include a channel hole 190 extending vertically through the alternating dielectric stack 100, the insulating layer 110 and the hard mask layer 120, a functional layer on the sidewall of the channel hole 190, and a channel layer 160 between the functional layer and a filling structure.

In some embodiments, fabrication processes to form the channel structure include forming a channel hole that extends vertically through the alternating dielectric stack 100, the insulating layer 110 and the hard mask layer 120. The channel hole 190 can be formed by etching the alternating dielectric stack 100, the insulating layer 110 and the hard mask layer 120, and a subsequent cleaning process. The etching process to form the channel hole 190 can be a wet etching, a dry etching, or a combination thereof.

In some embodiments, fabrication processes to form a functional layer on the sidewall of the channel hole 190. The functional layer can be a composite dielectric layer, such as a combination of a tunneling layer 130, a storage layer 140, and a barrier layer 150. The functional layer, including the tunneling layer 130, the storage layer 140, and the barrier layer 150, can be formed by one or more thin film deposition processes, such as ALD, CVD, PVD, any other suitable processes, or any combination thereof.

As shown in FIG. 2A, the barrier layer 150 can be formed between the storage layer 140 and the sidewall of the channel 190. The barrier layer 150 can be used for blocking the outflow of the electronic charges. In some embodiments, the barrier layer 150 can be a silicon oxide layer or a combination of silicon oxide/silicon nitride/silicon oxide (ONO) layers. In some embodiments, the barrier layer 150 includes high dielectric constant (high-k) dielectrics (e.g., aluminum oxide). In some embodiments, a thickness of the barrier layer 150 can be in a range from about 3 nm to 20 nm.

The storage layer 140 can be formed between the tunneling layer 130 and the barrier layer 150. Electrons or holes from the channel layer can tunnel to the storage layer 140 through the tunneling layer 130. The storage layer 140 can be used for storing electronic charges (electrons or holes) for memory operation. The storage or removal of charge in the storage layer 140 can impact the on/off state and/or a conductance of the semiconductor channel. The storage layer 140 can include one or more films of materials including, but are not limited to, silicon nitride, silicon oxynitride, a combination of silicon oxide and silicon nitride, or any combination thereof. In some embodiments, the storage layer 140 can include a nitride layer formed by using one or more deposition processes. In some embodiments, a thickness of the storage layer 140 can be in a range from about 3 nm to 20 nm The tunneling layer 130 can be formed on the sidewall of the storage layer 140. The tunneling layer 130 can be used for tunneling electronic charges (electrons or holes). The tunneling layer 130 can include dielectric materials including, but not limited to, silicon oxide, silicon nitride, silicon oxynitride, or any combination thereof. In some embodiments, the tunneling layer 130 can be an oxide layer formed by using a deposition process. In some embodiments, a thickness of the tunneling layer 130 can be in a range from about 3 nm to 20 nm.

In some embodiments, fabrication processes to form the channel structure further include forming a channel layer 160 covering the sidewall of the functional layer and the top surface of hard mask layer 120. In some embodiments, the channel layer 160 can be an amorphous silicon layer or a polysilicon layer formed by using a thin film deposition process, such as ALD, CVD, PVD, or any other suitable process. In some embodiments, a thickness of the channel layer 160 can be in a range from about 5 nm to 20 nm.

In some embodiments, fabrication processes to form the channel structure further include forming a filling structure 170 to cover the channel layer 160 and fill the channel hole 190. In some embodiments, the filling structure 170 can be an oxide layer formed by using any suitable deposition process, such as ALD, CVD, PVD, etc. In some embodiments, the filling structure 170 can include one or more airgaps.

Referring to FIG. 2B, the portions of the tunneling layer 160 and the filling structure 170 located on the top surface of the hard mask layer 120 can be removed. In some embodiments, the removal process can include, but not limited to, wafer grinding, dry etch, wet etch, chemical mechanical planarization (CMP), any other suitable processes, or any combination thereof. In some embodiment, in the same removal process, the functional layer including the barrier layer 150, the storage layer 140 and the tunneling layer 130 located on the top surface of the hard mask layer 120 can also be removed.

Figure 5:
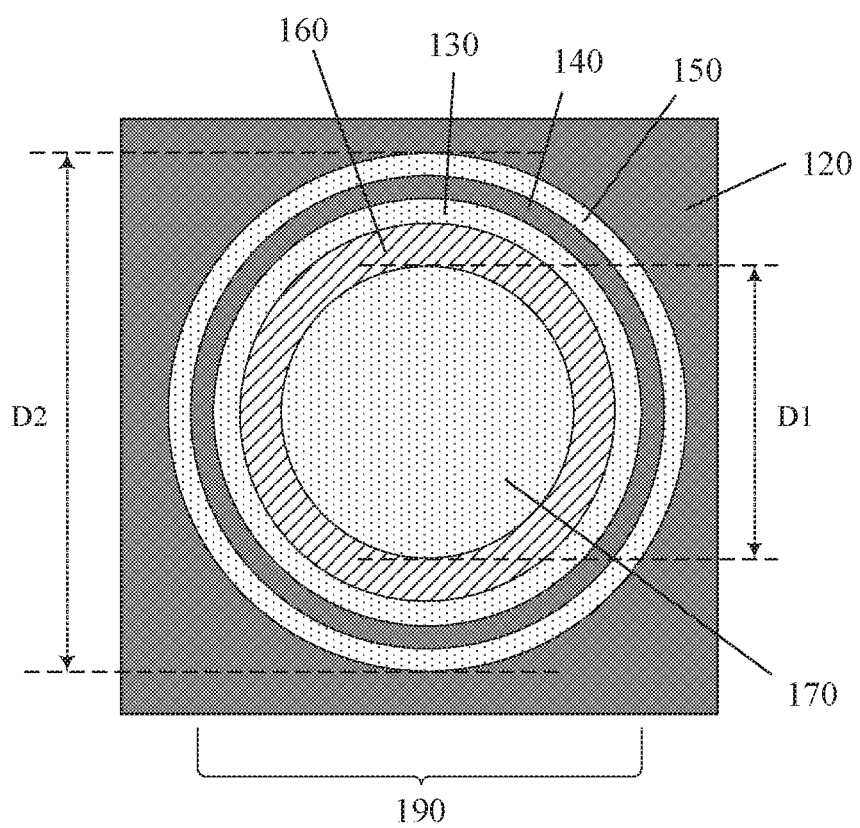
FIG. 5 illustrates a top view of a channel hole of an exemplary 3D memory device in accordance with some other embodiments of the present disclosure; and Embodiments of the present disclosure will be described with reference to the accompanying drawings.

FIG. 5 illustrates a top view of the channel structure of an exemplary 3D memory device in accordance with some other embodiments of the present disclosure. After the removal process, the top surface of the channel structure has an approximate round shape that is surrounded by the hard mask layer 120. The top surface of the channel structure has a filling structure 170 in the center of the channel hole 190, and multiple rings including the channel layer 160, the tunneling layer 130, the storage layer 140 and the barrier layer 150 that surround the filling structure 170 from inside to outside.

The top surface of the filling structure 170 can have an approximate round shape. A diameter D1 of the top surface of the filling structure 170 in the lateral direction can be in a range from about 40 nm to 100 nm. A diameter D2 of the top aperture of the channel hole 190 (which is same as the diameter of the top surface of the channel structure) in the lateral direction can be in a range from about 100 nm to 140 nm. It is noted that, the sizes and/or proportions of various layers and/or structures shown in the figures are used for illustrative purpose only, may not reflect the actual sizes and/or proportions of the layers and/or structures, thus do not limit the scope of the present disclosure.

Figure 2C:
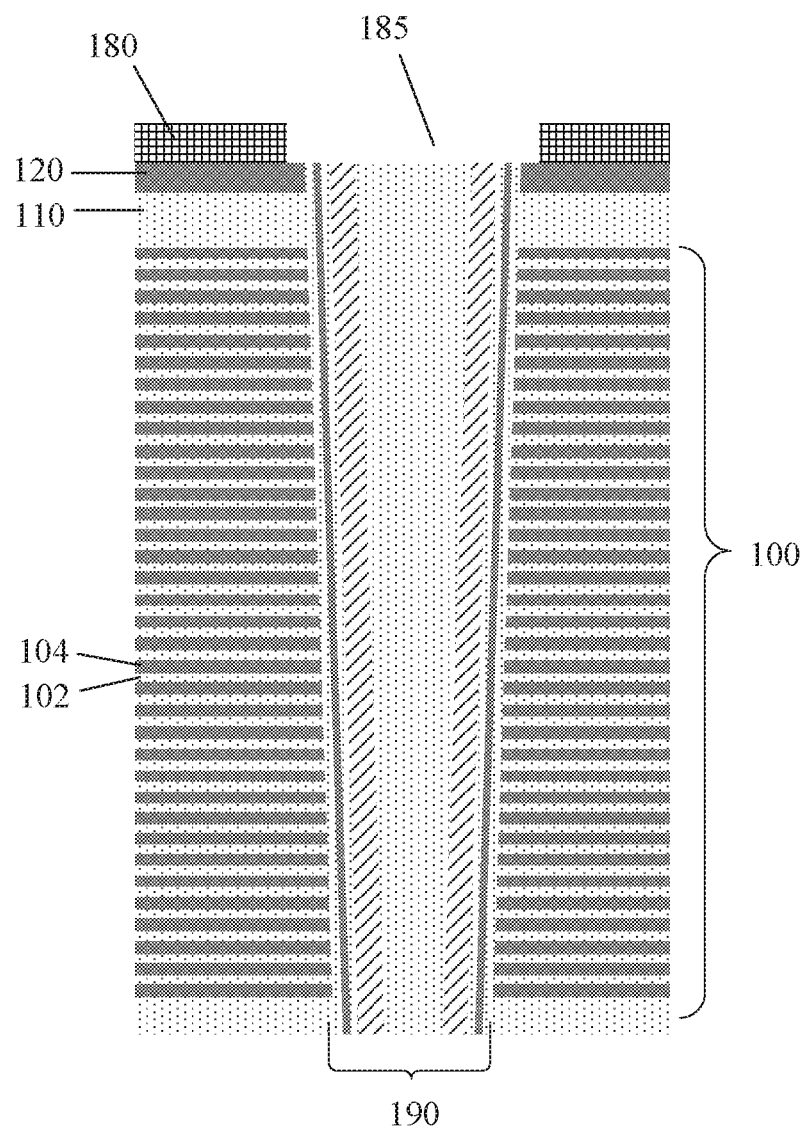

Referring to FIGS. 1 and 2C, the method proceeds to operation S8, in which a photoresist patterning 180 can be formed on the hard mask layer 120. The photoresist patterning 180 can include an opening 185 to expose the top surface of the channel structure.

In some embodiments, fabrication processes to form the photoresist patterning 180 can include forming a photoresist layer on the top surface of the hard mask layer 120 and the channel structure by using a spin-on coating process, and a subsequent patterning process to form the opening 185 that corresponds to the channel structure. In some embodiments, a diameter of the opening 185 can be slightly larger than the diameter D2 of the top surface of the channel structure.

Figure 2D:
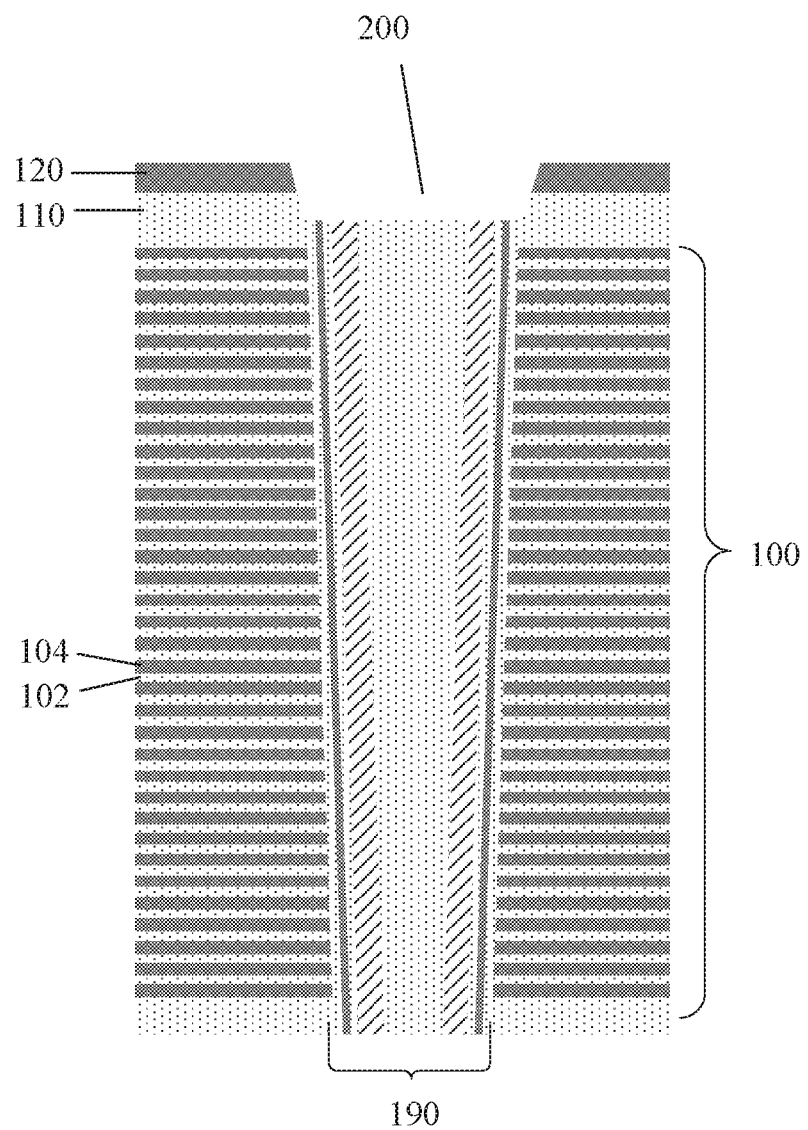

Referring to FIGS. 1 and 2D, the method proceeds to operation S10, in which a top portion of the channel structure can be removed to form a recess. In some embodiments, fabrication processes to remove the top portion of the channel structure can include an etching process and a cleaning process. By using the photoresist patterning 180 as the mask, one or more etching processes including, but not limited to, wet etching, dry etching, or combinations thereof, can be performed to remove the top portion of the channel structure. As such, a recess 200 penetrating the mask layer 120, extending into at least a portion of insulating layer 110, and above the remaining channel structure can be formed.

In some embodiments, as shown in FIG. 2D, the recess 200 may not have a perfect cylinder shape, but may have a shape approximating to a truncated cone. That is, the diameter of a top aperture of the recess 200 can be slightly larger than the diameter of a bottom aperture of the recess 200. It is noted that, the diameter of the bottom aperture of the recess 200 is equal to or larger than the diameter D2 of the top surface of the channel structure. After the recess 200 is formed, a cleaning process can be performed to remove the photoresist patterning 180.

Figure 2E:
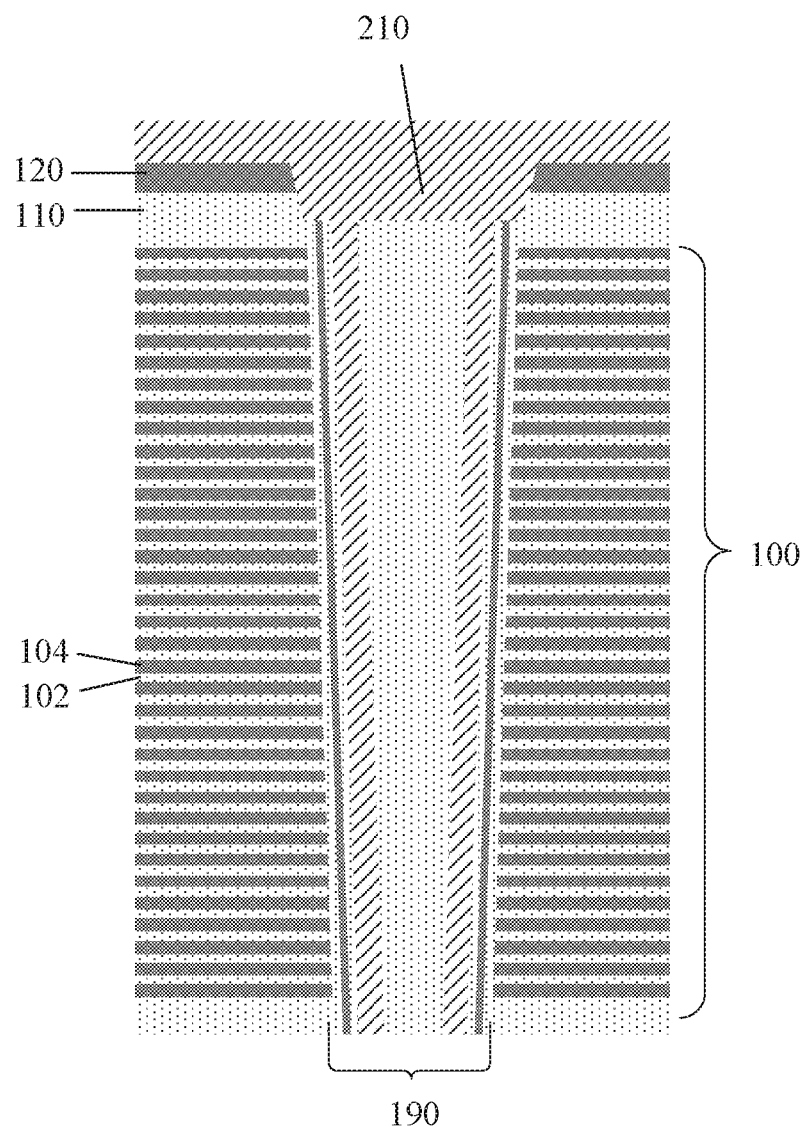

Referring to FIGS. 1 and 2D-2E, the method proceeds to operation S12, in which a channel hole plug can be formed in the recess. In some embodiments, fabrication processes to form the channel hole plug can include forming a semiconductor channel layer 210 to fill the recess 200 and cover the top surface of the hard mask layer 120, as shown in FIG. 2E. In some embodiments, the semiconductor channel layer 210 can be an amorphous silicon layer or a polysilicon layer formed by using a selective epitaxial process, or by using a thin film deposition process, such as ALD, CVD, PVD, or any other suitable process. The semiconductor channel layer 210 can be electrically in contact with the channel layer 160 in the channel structure.

Figure 2F:
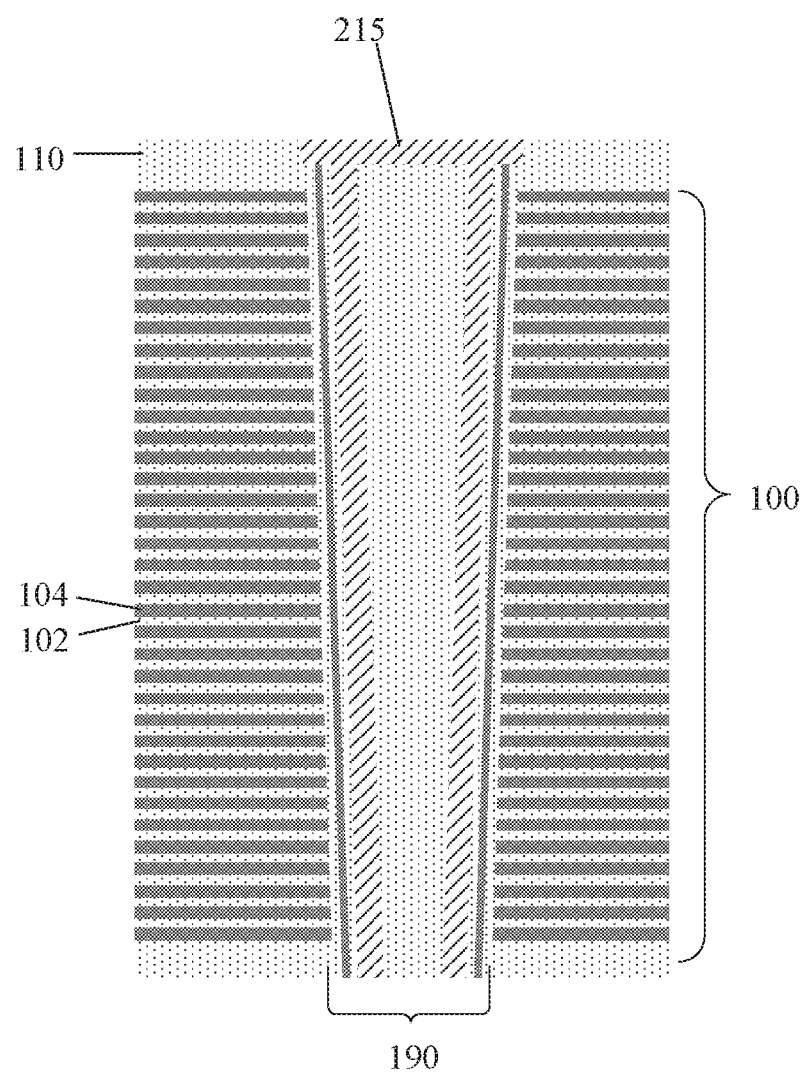

In some embodiments, fabrication processes to form the channel hole plug can include performing a removal to remove the hard mask layer 120 and a top portion of the semiconductor channel layer 210 to form the channel hole plug 215, as shown in FIG. 2F. In some embodiments, the removal process can include, but not limited to, wafer grinding, dry etch, wet etch, chemical mechanical planarization (CMP), any other suitable processes, or any combination thereof.

The remaining portion of the semiconductor channel layer 210 can form the channel hole plug 215 that is electrically in contact with the channel layer 160 in the channel structure. In some embodiments, a depth of the channel hole plug 215 in the vertical direction can be in a range from about 100 nm to about 1000 nm. The projection of the channel hole plug 215 in a lateral plane can cover the projection of the entire channel hole 190 or the entire channel structure in the lateral plane.

In the traditional fabricating method, the channel hole plug is formed on the sidewall of the channel layer 160 by recessing the filling structure 170 only. Due to the thickness limitation of the channel layer 160 and functional layer on the sidewall of the channel hole 190, the diameter of the channel hole plug is significantly limited (e.g., up to the diameter D1 of the top surface of the filling structure 170 in the lateral direction, as shown in FIG. 5). Such small-sized channel hole plug may lead to a higher resistance and a higher contact resistance.

Figure 2G:
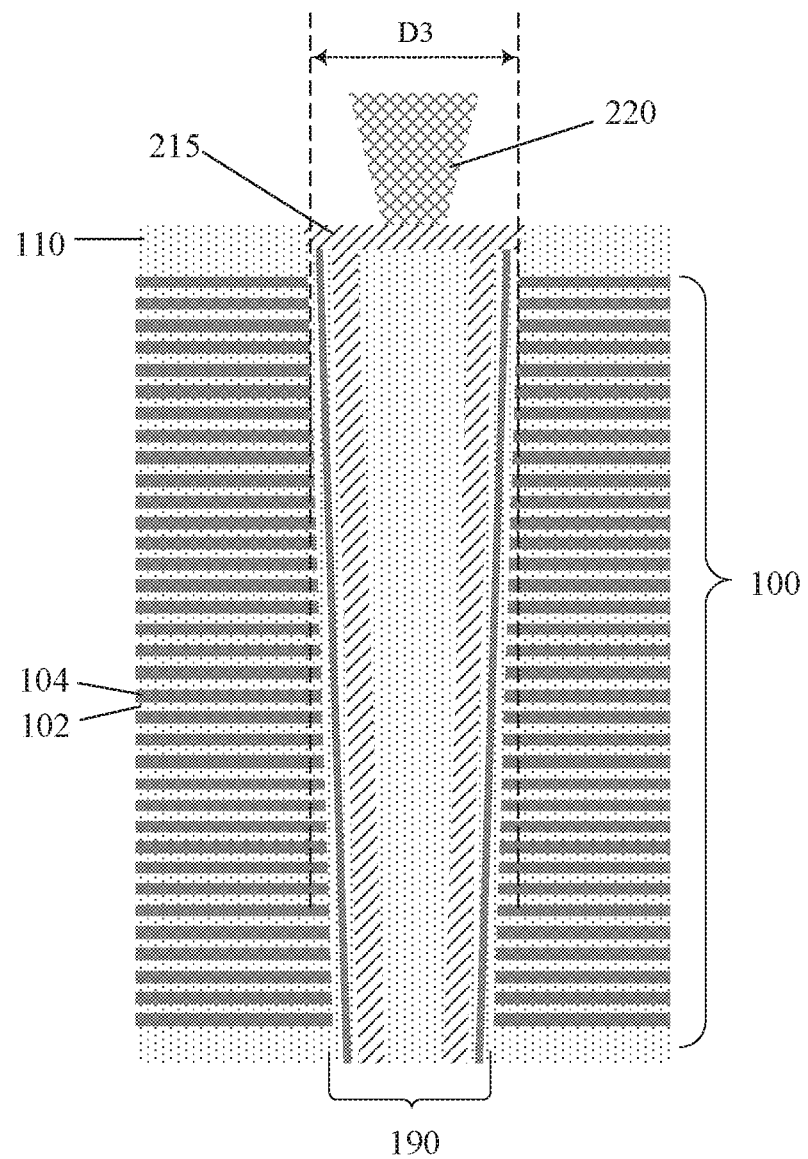

The channel hole plug 215 formed by the disclosed method can have a larger area by a lateral expansion. For example, as shown in FIG. 2G, a minimum diameter D3 of the channel hole plug 215 in the lateral direction can be equal to or larger than the diameter D2 of the top aperture of the channel hole 190 in the lateral direction. As such, the area of the channel hole plug 215 can be increased by at least 30% compared to the area of the channel hole plug formed by the traditional fabricating method. Thus, the disclosed channel hole plug 215 can have an increased channel hole electrical contact, thereby leading to an improved electric property.

Further, it is noted that, subsequent processes can be performed to further fabricate the 3D memory device. In some embodiments, as shown in FIG. 2G, a metal via 220 can be formed above the channel hole plug 215 for electronically connecting the channel hole plug 215 to back end of line (BEOL) metal lines, such as bit lines of double patterning structure. Since the area of the disclosed channel hole plug 215 is larger than the area of the channel hole plug made by the traditional method, a larger alignment margin for the metal via to land on the channel hole plug 215 can be achieved to enhance the product yield.

Figure 2H:
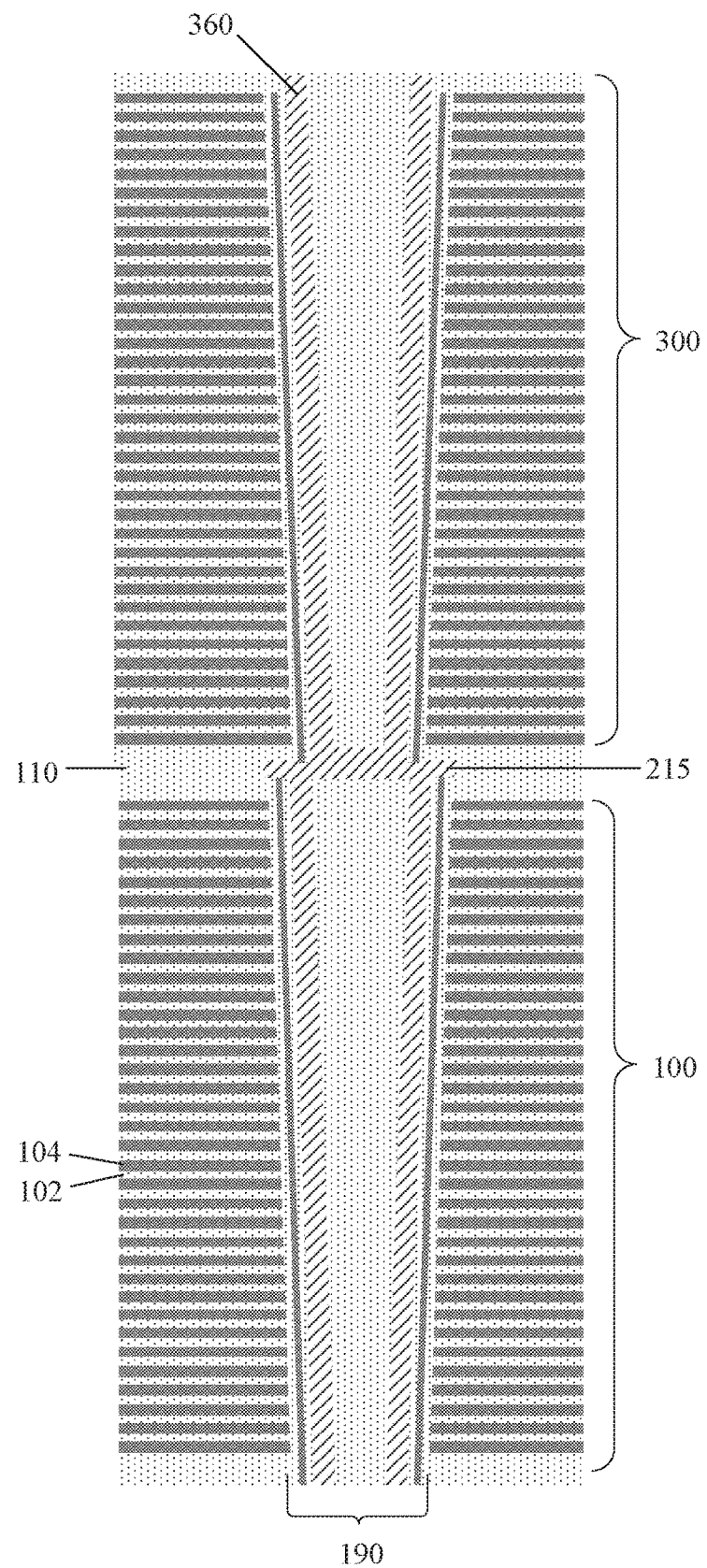

In some other embodiments, as shown in FIG. 2H, a second alternating dielectric stack 300 can be formed on the insulating layer 110 and the channel hole plug 215. A second channel structure can be formed penetrating the second alternating dielectric stack 300. A second channel layer 360 in the second channel structure is electrically in contact with the channel hole plug 215. The fabrication processes and the physical and chemical properties of the second alternating dielectric stack 300 and the second channel structure can be referred to the alternating dielectric stack 100 and the channel structure described above. Since the area of the disclosed channel hole plug 215 is larger than the area of the channel hole plug made by the traditional method, a larger alignment margin for the second channel layer 360 to land on the channel hole plug 215 can be achieved to enhance the product yield.

In some embodiments, a gate replacement process (also known as the "word line replacement" process) can be performed to replace second dielectric layers 104 (e.g., silicon nitride) of the alternating dielectric stack 100 with conductor layers (e.g., W). As a result, after the gate replacement process, the alternating dielectric stack 100 becomes alternating conductor/dielectric stack. The replacement of first dielectric layers with conductor layers can be performed by wet etching first dielectric layers (e.g., silicon nitride)

selective to second dielectric layers (e.g., silicon oxide) and filling the structure with conductor layers (e.g., W). Conductor layers can be filled by PVD, CVD, ALD, any other suitable process, or any combination thereof. Conductor layers can include conductive materials including, but not limited to, W, Co, Cu, Al, polysilicon, silicides, or any combination thereof. The formed alternating conductor/dielectric stack and remaining alternating dielectric stack can constitute an alternating stack.

Figure 3:
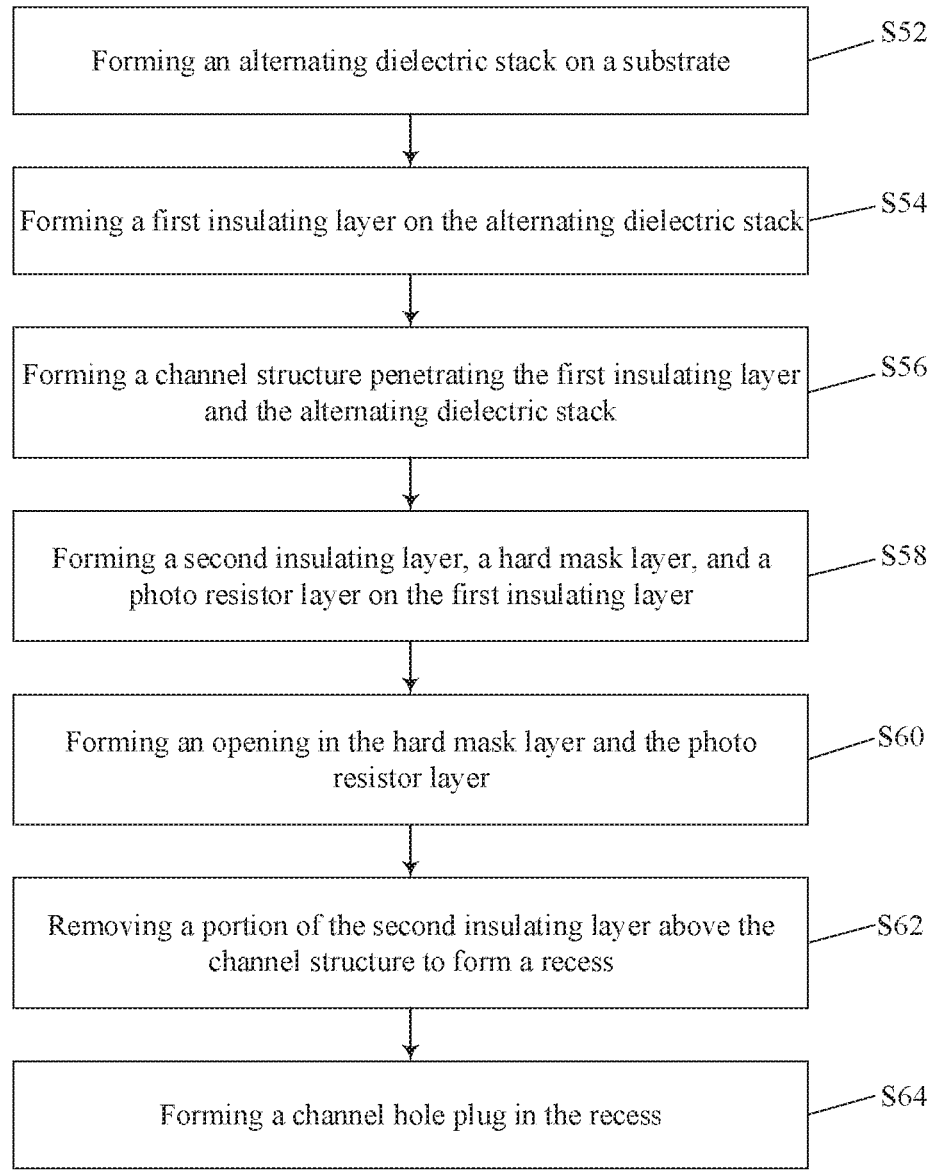
FIG. 3 illustrates a flow diagram of another exemplary method for forming a channel hole plug of a 3D memory device in accordance with some other embodiments of the present disclosure.

Referring to FIG. 3, a flow diagram of another exemplary method for forming a channel hole plug of a 3D memory device in accordance with some other embodiments of the present disclosure. FIGS. 4A-4E illustrate cross-sectional views of a region of an exemplary 3D memory device at certain fabricating stages of the method shown in FIG. 3. It is noted that, the description of the method below may only include the differences compared to the method described above in connection with FIGS. 1 and 2A-2H. Some detailed information of the fabrication processes and physical and chemical properties of various operations of the method and/or various components of the 3D memory device can be referred to the corresponding descriptions above.

Figure 4A:
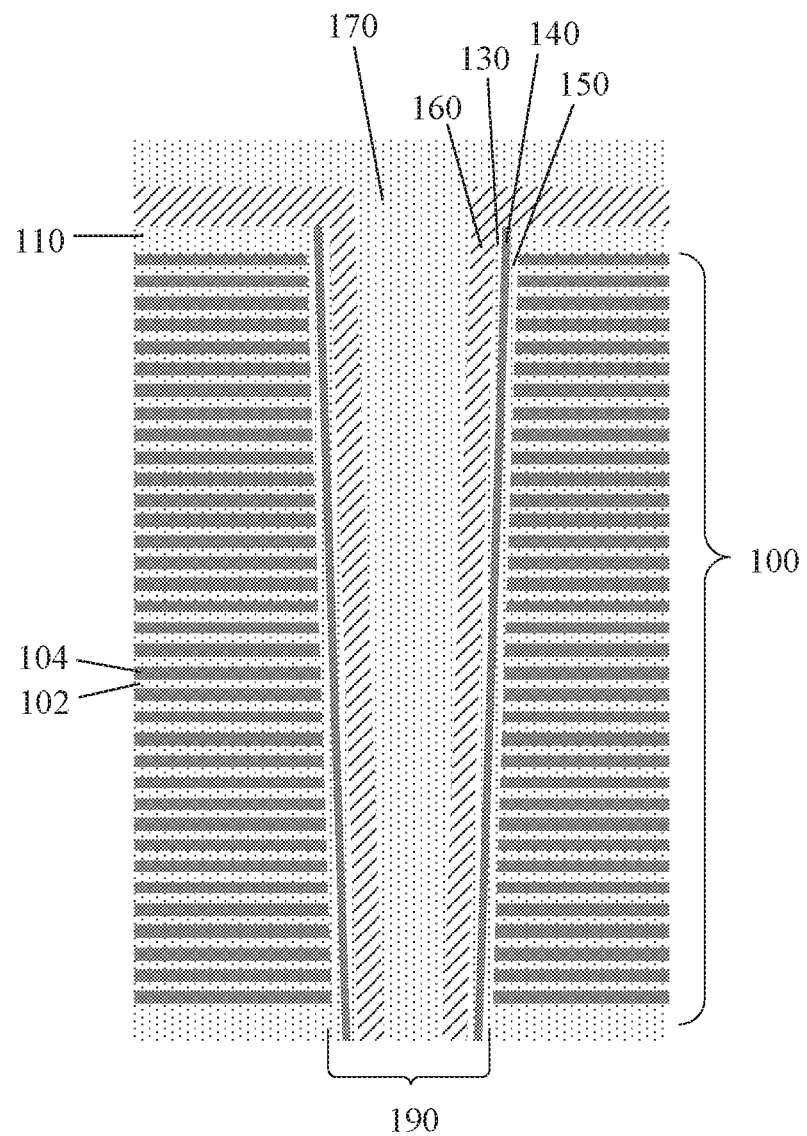
FIGS. 4A-4E illustrate cross-sectional views of a region of an exemplary 3D memory device at certain fabricating stages of the method shown in FIG. 3.

As shown in FIGS. 3 and 4A, the method starts at operation S52, in which an alternating dielectric stack 100 is formed on a substrate (not shown). The alternating dielectric stack 100 can include an alternating stack of a first dielectric layer 102 (e.g., silicon oxide layer) and a second dielectric layer 104 (e.g., silicon nitride layer) that is different from first dielectric layer. At operation S54, the method proceeds to form a first insulating layer 110 on the alternating dielectric stack 100.

Figure 4B:
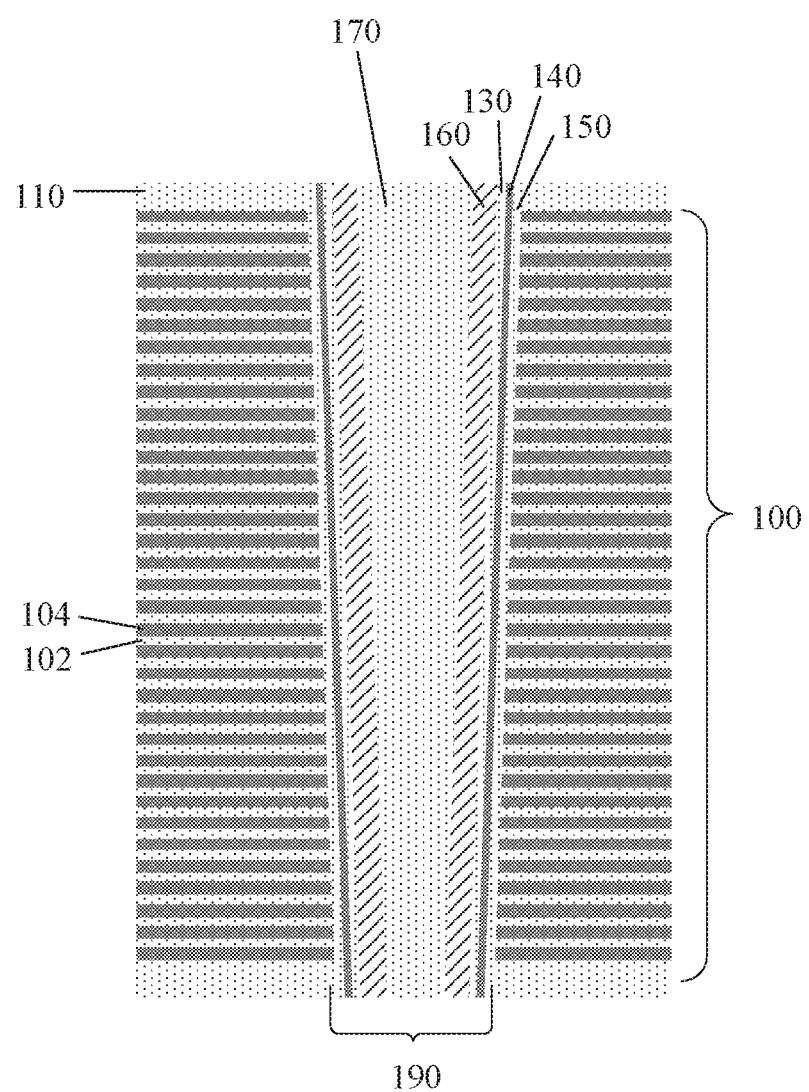

Referring to FIGS. 3 and 4A-4B, the method proceeds to operation S56, in which a channel structure can be formed. The channel structure can include a channel hole 190 extending vertically through the alternating dielectric stack 100 and the first insulating layer 110, a functional layer on the sidewall of the channel hole 190, and a channel layer 160 between the functional layer and a filling structure. The functionally layer can be a composite dielectric layer, such as a combination of a tunneling layer 130, a storage layer 140, and a barrier layer 150. As shown in FIG. 4B, a removal process can be performed to remove the portion of the functional layer, the channel layer 160, and the filling structure outside of the channel hole 190 and above the first insulating layer 110, and to planarize the top surface of the first insulating layer 110 and the channel structure. A top view of the channel structure can be referred to FIG. 5 and the corresponding description above.

Figure 4C:
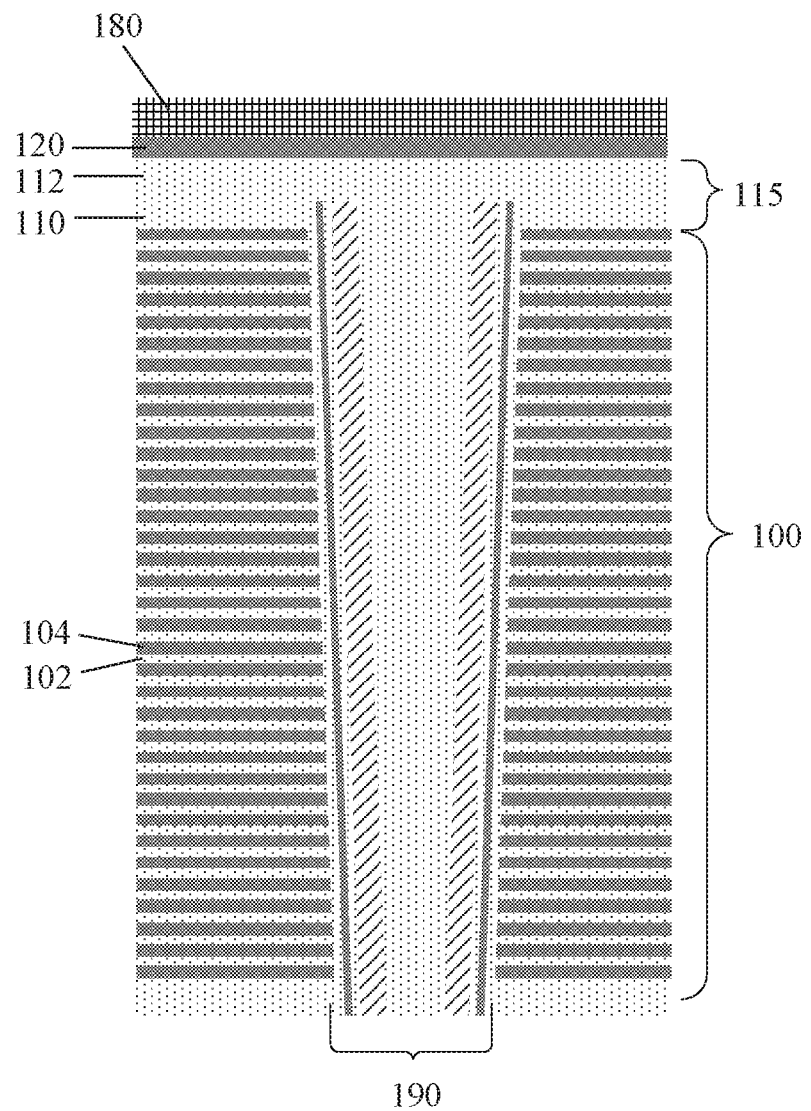

Referring to FIGS. 3 and 4C, the method proceeds to operation S58, in which a second insulating layer 112, a hard mask layer 120 and a photoresist layer 180 can be sequentially formed on the first insulating layer 110. In some embodiments, the material of the second insulating layer 112 can be the same material of the first insulating layer 110, such as silicon oxide. The second insulating layer 112 and the first insulating layer 110 can form a plug insulating layer 115.

Figure 4D:
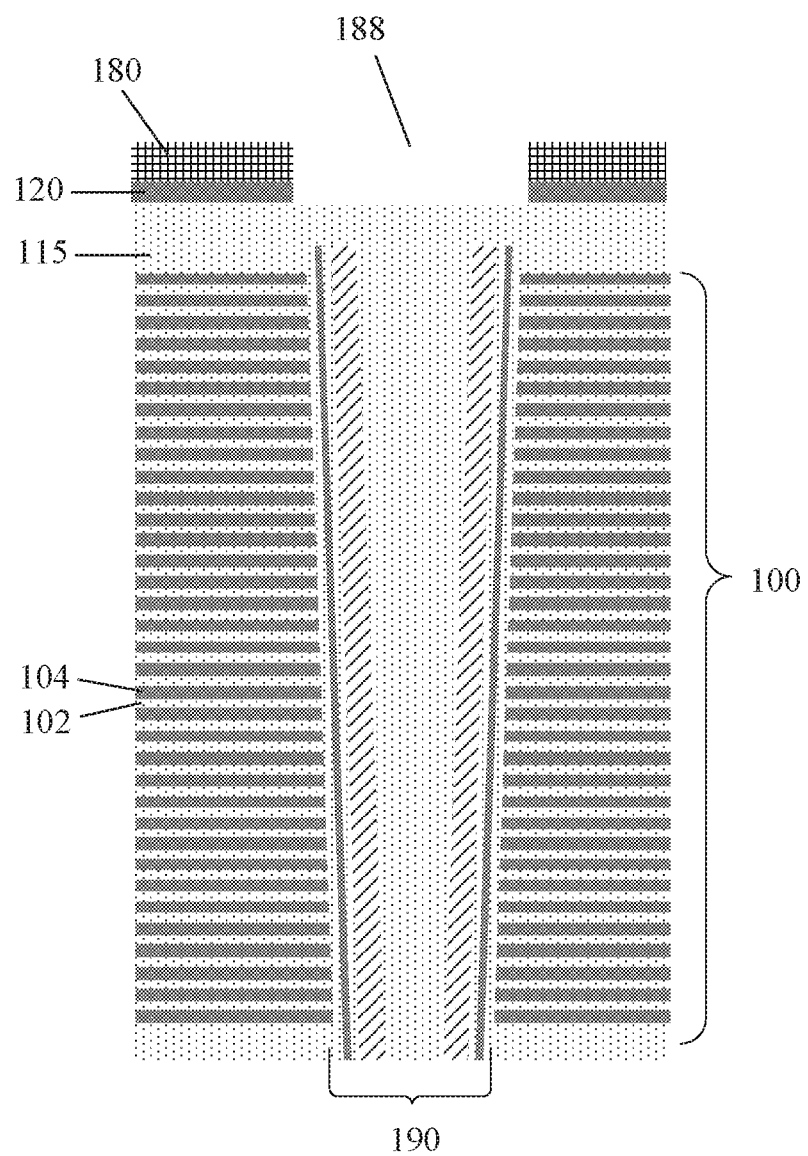

Referring to FIGS. 3 and 4D, the method proceeds to operation S60, in which an opening 188 can be formed in the hard mask layer 120 and the photoresist layer 180. A position of the opening 188 can be aligned to match the top surface of the channel structure. In some embodiments, a diameter of the opening 188 can be slightly larger than the diameter D2 of the top surface of the channel structure. In some embodiments, the opening 188 can be formed by using any suitable patterning process.

Figure 4E:
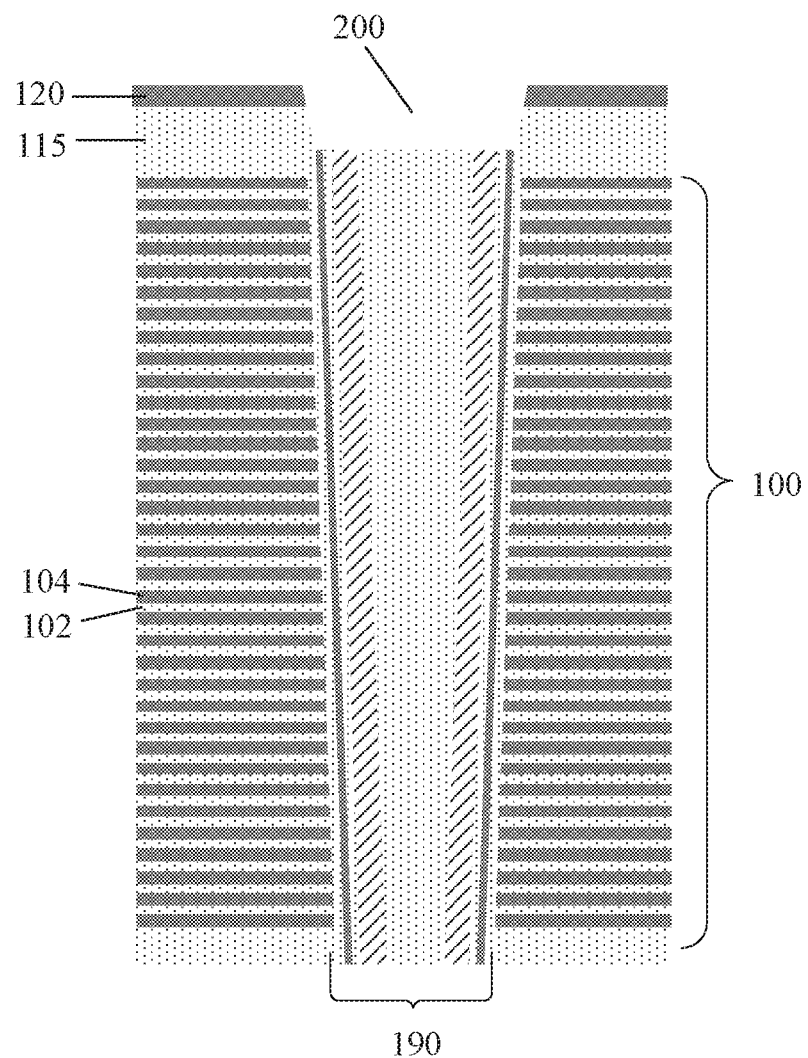

Referring to FIGS. 3 and 4E, the method proceeds to operation S62, in which a portion of the plug insulating layer 115 above the channel structure can be removed to form a recess. In some embodiments, fabrication processes to remove the portion of the plug insulating layer 115 above the channel structure can include an etching process and a cleaning process. By using the hard mask layer 120 and the photoresist patterning 180 as the mask, a wet/dry etching process can be performed to remove the portion of the plug insulating layer 115 above the channel structure. As such, a recess 200 penetrating the mask layer 120, extending into the plug insulating layer 115, and exposing the top surface of the channel structure can be formed.

As shown in FIG. 3, the method proceeds to operation S64, in which a channel hole plug can be formed in the recess (referring back to operation S12 described above in connection with FIGS. 2E-2F). Further, the method can include any suitable subsequent processes, such as metal via formation process, additional alternating dielectric stack formation process, gate replacement process (referring back to the description above in connection with FIGS. 2G-2H), etc. Since the area of the disclosed channel hole plug can be larger than the area of the channel hole plug made by the traditional method, a larger alignment margin for an interconnection structure (e.g., a metal via, an additional channel layer, etc.) to land on the channel hole plug can be achieved to enhance the product yield.

Various embodiments in accordance with the present disclosure provide a channel hole plug structure of 3D memory devices and fabricating methods thereof. In some embodiments of method disclosed herein, the channel hole structure can be formed through a stack of alternating dielectric layers, which can be more easily etched to form channel holes therein compared with a stack of alternating conductor and dielectric layers, thereby reducing the process complexity and manufacturing cost. A channel hole plug can be formed above the channel hole to electrically connect with a channel structure in the channel hole. A projection of the polysilicon plug in a lateral plane can cover the projection of the channel hole in the lateral plane. As such, the polysilicon plug can provide a reliable electrical connection to the channel structure in the channel hole and an increased contact alignment in the subsequent processes.

In some embodiments, the present disclosure provides a method for forming a channel hole plug structure in a three-dimensional (3D) memory device. The method can comprise: forming an alternating dielectric stack disposed on a substrate; forming an insulating layer and a hard mask layer on the alternating dielectric stack; forming a channel structure penetrating the insulating layer, the hard mask layer, and the alternating dielectric stack; forming a photoresist patterning on the hard mask layer; using the photoresist patterning as a mask to remove a top portion of the channel structure to form a recess; and forming a channel hole plug in the recess. A projection of the channel hole plug in a lateral plane covers a projection of the channel hole in the lateral plane.

In some embodiments, forming the alternating dielectric stack comprises forming at least 32 dielectric layer pairs stacked in a vertical direction, each dielectric layer pair includes a first dielectric layer and a second dielectric layer that is different from the first dielectric layer. In some embodiments, forming the alternating dielectric stack comprises forming at least 32 dielectric layer pairs stacked in a vertical direction, each dielectric layer pair includes a silicon oxide layer and a silicon nitride layer.

In some embodiments, forming the insulating layer and the hard mask layer comprises: forming an oxide layer on the alternating dielectric stack as the insulating layer; and forming a nitride layer on the oxide layer as the hard mask layer.

In some embodiments, forming the channel structure comprises: forming a channel hole extending vertically through the alternating dielectric stack, the insulating layer and the hard mask layer; forming a functional layer on a sidewall of the channel hole; forming a channel layer covering a sidewall of the functional layer; and forming a filling structure to cover a sidewall of the channel layer and filling the channel hole.

In some embodiments, forming the functional layer comprises: forming a barrier layer on the sidewall of the channel hole for blocking an outflow of the electronic charge; forming a storage layer on the surface of the barrier layer for storing electronic charges during operation of the 3D memory device; and forming a tunneling layer on the surface of the storage layer for tunneling electronic charges.

In some embodiments, forming the photoresist patterning comprises: forming a photoresist layer on the hard mask layer and the channel structure; forming an opening in the photoresist layer to expose the top surface of the channel structure, wherein a diameter of the opening is equal to or larger than a diameter of the top surface of the channel structure; and removing the photoresist layer.

In some embodiments, forming the channel hole plug in the recess comprises: forming a semiconductor channel layer on the hard mask layer and in the recess to electrically connect with the channel layer in the channel structure; and removing a portion of the semiconductor channel layer that is outside of the recess, and to planarize a top surface of the channel hole plug.

In some embodiments, the method further comprises forming a metal via to electrically connect with the channel hole plug.

In some embodiments, the method further comprises: forming a second alternating dielectric stack on the channel hole plug; forming a second channel structure penetrating the second alternating dielectric stack. A second channel layer in the second channel structure is electrically connected with the channel hole plug.

In some embodiments, the method further comprises replacing first dielectric layers with conductor layers.

Another aspect of the present disclosure provides a method for forming a channel hole plug structure in a three-dimensional (3D) memory device. The method comprises: forming an alternating dielectric stack disposed on a substrate; forming a first insulating layer on the alternating dielectric stack; forming a channel structure penetrating the first insulating layer and the alternating dielectric stack; forming a second insulating layer, a hard mask layer, and a photoresist patterning on the first insulating layer; forming an opening in the hard mask layer and the photoresist layer to expose the second insulating layer, wherein a projection of the opening in a lateral plane covers a top surface of the channel structure; removing a portion of the second insulating layer above the channel structure to form a recess using the hard mask layer or the photoresist layer as a mask; and forming a channel hole plug in the recess. A projection of the channel hole plug in a lateral plane covers a projection of the channel hole in the lateral plane.

In some embodiments, forming the second insulating layer, the hard mask layer and the photoresist patterning comprises: forming an oxide layer on the first insulating layer and the channel structure as the second insulating layer; forming a nitride layer on the oxide layer as the hard mask layer; and forming a photoresist layer on the nitride layer.

In some embodiments, forming the channel hole plug in the recess comprises: forming a semiconductor channel layer on the hard mask layer and in the recess to electrically connect with the channel layer in the channel structure; and removing a portion of the semiconductor channel layer that is outside of the recess, and to planarize a top surface of the channel hole plug Another aspect of the present disclosure provides a three-dimensional (3D) memory device, comprising: an alternating layer stack disposed on a substrate; an insulating layer disposed on the alternating dielectric stack; a channel hole extending vertically through the alternating dielectric stack and the insulating layer; a channel structure including a channel layer in the channel hole; and a channel hole plug in the insulating layer and above the channel structure. The channel hole plug is electrically connected with the channel layer. A projection of the channel hole plug in a lateral plane covers a projection of the channel hole in the lateral plane.

In some embodiments, the alternating layer stack comprises at least 32 dielectric layer pairs stacked in a vertical direction, each dielectric layer pair includes a first dielectric layer and a second dielectric layer that is different from the first dielectric layer. In some embodiments, the alternating layer stack comprises at least 32 dielectric layer pairs stacked in a vertical direction, each dielectric layer pair includes a silicon oxide layer and a silicon nitride layer.

In some embodiments, the alternating dielectric layer comprises at least 32 dielectric/conductor layer pairs stacked in a vertical direction, each dielectric layer pair includes a dielectric layer and a metal layer. In some embodiments, the alternating dielectric layer comprises at least 32 dielectric/conductor layer pairs stacked in a vertical direction, each dielectric layer pair includes a silicon oxide layer and a tungsten layer.

In some embodiments, the insulating layer is an oxide layer, and the channel hole plug is a polysilicon layer.

In some embodiments, the channel structure comprises a functional layer and a filling structure that sandwich the channel layer.

In some embodiments, the functional layer comprises: a barrier layer on the sidewall of the channel hole configured to block an electric outflow tunnel electronic charges; a storage layer on the surface of the barrier layer configured to store electronic charges; and a tunneling layer between the storage layer and the channel layer configured to tunnel electronic charges.

In some embodiments, a thickness of the channel hole plug is in a range from 100 nm to 1000 nm, and a minimum diameter of the channel hole plug is 100 nm.

In some embodiments, the device further comprises: a second alternating layer stack on the channel hole plug; and a second channel structure penetrating the second alternating layer stack. A second channel layer in the second channel structure is electrically connected with the channel hole plug. In some embodiments, the device further comprises a metal via electrically connected with the channel hole plug.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a channel hole plug structure in a three-dimensional (3D) memory device, comprising:
    forming an alternating dielectric stack disposed on a substrate;
    forming a first insulating layer on the alternating dielectric stack;
    forming a channel structure penetrating the first insulating layer and the alternating dielectric stack, wherein the channel structure includes a functional layer, a channel layer, and a filling structure;
    forming a second insulating layer directly on the first insulating layer and the channel structure;
    forming a hard mask layer directly on the second insulating layer;
    forming a photoresist layer directly on the hard mask layer;
    forming an opening in the hard mask layer and the photoresist layer to expose the second insulating layer, wherein a diameter of the opening in a lateral plane is larger than a diameter of a top surface of the channel structure;
    removing, using the hard mask layer or the photoresist layer as a mask, a portion of the second insulating layer above the channel structure to form a recess in the first and second insulating layers, wherein a bottom aperture of the recess exposes the top surface of the channel structure;
    forming a semiconductor layer in the recess and on the hard mask layer, wherein the semiconductor layer is formed using a same semiconductor material of the channel layer, and in contact with the channel layer; and
    removing the hard mask layer and a top portion of the semiconductor layer, such that a remaining portion of the semiconductor layer embedded in the first and second insulating layers forms a channel hole plug in the recess, wherein a diameter of the channel hole plug in a lateral plane is larger than the diameter of the top surface of the channel structure.

2. The method of claim 1, wherein forming the alternating dielectric stack comprises:
    forming at least 32 dielectric layer pairs stacked in a vertical direction, each dielectric layer pair includes a first dielectric layer and a second dielectric layer that is different from the first dielectric layer.

3. The method of claim 1, wherein forming the channel structure comprises:
    forming a channel hole extending vertically through the alternating dielectric stack and the first insulating layer;
    forming the functional layer on a sidewall of the channel hole;
    forming the channel layer covering a sidewall of the functional layer; and
    forming the filling structure to cover a sidewall of the channel layer and filling the channel hole.

4. The method of claim 3, wherein forming the functional layer comprises:
    forming a barrier layer on the sidewall of the channel hole for blocking an outflow of the electronic charges;
    forming a storage layer on a surface of the barrier layer for storing electronic charges during operation of the 3D memory device; and
    forming a tunneling layer on a surface of the storage layer for tunneling electronic charges.

5. The method of claim 1, wherein forming the second insulating layer, the hard mask layer and the photoresist patterning comprises:
    forming an oxide layer on the first insulating layer and the channel structure as the second insulating layer;
    forming a nitride layer on the oxide layer as the hard mask layer; and
    forming a photoresist layer on the nitride layer.

6. The method of claim 2, further comprising:
    performing a gate replacement process to replace first dielectric layers with conductor layers.

7. The method of claim 1, wherein:
    the first insulating layer and the second insulating layer have a same material and form a plug insulating layer.

8. The method of claim 1, further comprising:
    forming a metal via above the channel hole plug for electronically connecting the channel hole plug.

9. The method of claim 1, further comprising:
    forming a second alternating dielectric stack on the second insulating layer and the channel hole plug; and
    forming a second channel structure penetrating the second alternating dielectric stack, wherein a second channel layer in the second channel structure is electrically in contact with the channel hole plug.

* * * * *